United States Patent
Zhang et al.

(10) Patent No.: US 10,297,662 B2
(45) Date of Patent: May 21, 2019

(54) DIELECTRICALLY ISOLATED SEMICONDUCTOR DEVICE AND METHOD FOR MANUFACTURING THE SAME

(71) Applicants: Hangzhou Silan Microelectronics Co., Ltd., Hangzhou (CN); Hangzhou Silan Integrated Circuit Co., Ltd., Hangzhou (CN)

(72) Inventors: Changjun Zhang, Hangzhou (CN); Feng Ji, Hangzhou (CN); Ping Wang, Hangzhou (CN); Zuyin Chen, Hangzhou (CN)

(73) Assignees: HANGZHOU SILAN MICROELECTRONICS CO., LTD., Hangzhou (CN); HANGZHOU SILAN INTEGRATED CIRCUIT CO., LTD., Hangzhou (CN)

( * ) Notice: Subject to any disclaimer, the term of this patent is extended or adjusted under 35 U.S.C. 154(b) by 0 days.

(21) Appl. No.: 14/985,520

(22) Filed: Dec. 31, 2015

(65) Prior Publication Data
US 2017/0179227 A1 Jun. 22, 2017

(30) Foreign Application Priority Data
Dec. 22, 2015 (CN) .......................... 2015 1 0980166

(51) Int. Cl.
*H01L 21/70* (2006.01)
*H01L 29/06* (2006.01)
(Continued)

(52) U.S. Cl.
CPC ...... *H01L 29/0649* (2013.01); *H01L 21/2253* (2013.01); *H01L 21/3063* (2013.01);
(Continued)

(58) Field of Classification Search
CPC ... H01L 2924/00014; H01L 2924/0002; H01L 2924/00; H01L 2224/034; H01L 23/5226;
(Continued)

(56) References Cited

U.S. PATENT DOCUMENTS 3,954,523 A 5/1976 Magdo et al.
4,111,724 A 9/1978 Ogiue et al.
(Continued)

FOREIGN PATENT DOCUMENTS

CN 86108395 A 9/1987
CN 1845332 A 10/2006
(Continued)

OTHER PUBLICATIONS

First Chinese Office Action, including Search Report, for Chinese Patent Application No. 201510980166.9, dated Mar. 8, 2018, 9 pages.

*Primary Examiner* — Robert G Bachner
(74) *Attorney, Agent, or Firm* — Westman, Champlin & Koehler, P.A.

(57) ABSTRACT

The present disclosure relates to a dielectrically isolated semiconductor device and a method for manufacturing the same. The dielectrically isolated semiconductor device includes a semiconductor substrate, a first semiconductor layer above the semiconductor substrate, a second semiconductor layer above the first semiconductor layer, a semiconductor island in the second semiconductor layer, and a first dielectric isolation layer surrounding a bottom and sidewalls of the semiconductor island. The first dielectric isolation layer includes a first portion which is formed from a portion of the first semiconductor layer and extending along the bottom of the semiconductor island, and a second portion which is formed from a portion of the second semiconductor layer and extending along the sidewalls of the semiconduc-
(Continued)

tor island. The dielectrically isolated semiconductor devices needs no an SOI wafer and reduces manufacturing cost.

22 Claims, 4 Drawing Sheets

(51) Int. Cl.
*H01L 21/225* (2006.01)
*H01L 21/3063* (2006.01)
*H01L 21/308* (2006.01)
*H01L 23/535* (2006.01)
*H01L 29/66* (2006.01)
*H01L 29/861* (2006.01)
*H01L 21/762* (2006.01)

(52) U.S. Cl.
CPC ...... *H01L 21/3085* (2013.01); *H01L 21/7627* (2013.01); *H01L 23/535* (2013.01); *H01L 29/66136* (2013.01); *H01L 29/8611* (2013.01); *H01L 29/8613* (2013.01)

(58) Field of Classification Search
CPC ..... H01L 21/76816; H01L 2224/03616; H01L 23/481; H01L 23/528; H01L 2924/00012; H01L 2224/0361; H01L 2224/039; H01L 2224/0391; H01L 2224/03914; H01L 2224/05187; H01L 2224/94; H01L 22/34; H01L 21/76834; H01L 21/76877; H01L 21/76885; H01L 23/5222; H01L 23/53238; H01L 21/76849; H01L 21/76898; H01L 2224/03312; H01L 2224/0332; H01L 2224/0345; H01L 2224/03452; H01L 2224/0346; H01L 2224/03462; H01L 2224/05012; H01L 2224/05015; H01L 2224/05624; H01L 2224/05647; H01L 2224/05655; H01L 2224/05671; H01L 2224/11312; H01L 2224/1132; H01L 2224/1145; H01L 2224/1146; A61K 2300/00; A61K 31/05; A61K 31/11; A61K 31/122; A61K 31/7048; A61K 38/00; A61K 2039/505; A61K 45/06; A61K 2039/55522; A61K 31/427; A61K 31/4439; A61K 31/496; A61K 31/50; A61K 31/53; A61K 31/7028; A61K 33/26; A61K 38/16; A61K 38/1709; A61K 39/0011; A61K 39/39; A61K 41/0052; A61K 47/02; A61K 47/48215; A61K 49/06; A61K 49/1818; C08L 67/02; C08L 33/12; C08L 25/06; C08L 23/02; C08L 67/04; C08L 2203/02; C08L 2205/02; H04L 2209/12; H04L 9/3278; H04L 41/12; H04L 45/02; H04L 12/18; H04L 2025/03426; H04L 2025/03802; H04L 2463/142; H04L 25/0206; H04L 25/0226; H04L 25/0328; H04L 25/03343; H04L 27/2626; H04L 41/0816; H04L 41/0826; H04L 41/14; H04L 41/145; H04L 43/50; H04L 45/026; H04L 45/16; H04L 45/50; H04L 45/70; H04L 47/12; H04L 47/125; H04L 49/357; H04L 5/003; H04L 5/0037; H04L 5/0048; H04L 5/005; H04L 5/0053; H04L 5/0094; H04L 5/14; H04L 63/0236; H04L 63/1408; H04L 63/1458; H04L 65/608; H04L 67/06; H04L 67/10; H04L 67/125; A61B 5/6823; A61B 5/0022; A61B 5/02007; A61B 5/02125; A61B 5/02416; A61B 5/0295; A61B 5/0402; A61B 5/0404; A61B 5/053; A61B 5/4312; A61B 5/6867; A61B 5/7275; A61B 5/7282; A61B 17/3417; A61B 17/3478; A61B 2017/00247; A61B 2562/0214; A61B 5/0035; A61B 5/0091; A61B 5/0205; A61B 5/02055; A61B 5/02438; A61B 5/0245; A61B 5/0531; A61B 5/0536; A61B 5/0538; A61B 5/055; A61B 5/0809; A61B 5/14551; A61B 5/4244; A61B 5/4255; A61B 5/4337; A61B 5/4381; A61B 5/441; A61B 5/4542; A61B 5/486; A61B 5/681; A61B 5/6824; A61B 5/6828; A61B 5/6898; A61B 5/7207; A61B 5/7253; A61B 5/7257; A61B 5/726; A61B 5/7405; A61B 5/7425; A61B 5/743; A61B 5/7445; A61B 6/037; A61B 6/5247; A61B 8/0825; A61B 8/5261; A61N 1/0456; A61N 1/36021; A61N 1/40; A61N 2/006; A61N 2/008; A61N 2/02; A61N 1/36014; A61N 1/36025; A61N 1/36053; A61N 2/002; A61N 1/36075; G01V 1/364; G01V 2210/47; G01V 2210/56; G01V 1/282; G01V 1/32; G01V 1/325; G01V 1/38; G01V 2210/1293; G01V 2210/1423; G01V 2210/244; G01V 2210/324; G01V 2210/46; G01V 2210/48; G01V 2210/52; G01V 2210/671; G01V 2210/74

See application file for complete search history.

(56) References Cited

U.S. PATENT DOCUMENTS

| | | | |
|---|---|---|---|
| 5,741,723 | A | 4/1998 | Litwin |
| 6,118,152 | A * | 9/2000 | Yamaguchi ....... H01L 21/76264 257/347 |
| 2001/0023094 | A1 | 9/2001 | D'Arrigo et al. |
| 2003/0230778 | A1* | 12/2003 | Park ................. H01L 21/76243 257/349 |
| 2008/0283918 | A1* | 11/2008 | Cheng ................ H01L 21/2652 257/347 |
| 2012/0080686 | A1* | 4/2012 | Mauder ............... H01L 21/0237 257/76 |

FOREIGN PATENT DOCUMENTS

| | | |
|---|---|---|
| CN | 103681881 A | 3/2014 |
| CN | 103887172 A | 6/2014 |
| CN | 205508823 U | 8/2016 |

* cited by examiner

DIELECTRICALLY ISOLATED SEMICONDUCTOR DEVICE AND METHOD FOR MANUFACTURING THE SAME

CLAIM OF PRIORITY

This application claims priority to Chinese Application No. 201510980166.9, filed on Dec. 22, 2015, which is hereby incorporated by reference.

BACKGROUND OF THE DISCLOSURE

Field of the Disclosure

The present disclosure relates to semiconductor technology, and more particularly, to dielectrically isolated semiconductor devices and a method for manufacturing the same.

Description of the Related Art

Silicon on insulator (SOI) includes a semiconductor layer and an insulation layer below the semiconductor layer. The insulation layer can be buried oxide layer in a single-crystal silicon substrate. Various semiconductor devices may be formed in SOI, including transistors and diodes, in which the semiconductor layer of the SOI forms active regions of semiconductor devices. Further, the insulation layer isolates the active region of the semiconductor layer from the semiconductor substrate so as to suppress a leakage current through the semiconductor substrate and parasitic capacitance. Thus, the semiconductor devices have some advantages such as high speed, low power consumption and high reliability, if being formed from SOI. For example, transient response speed of a diode is an important parameter when for the purpose of ESD (Electro-Static Discharge) protection. The diode on basis of SOI can operate in high-speed applications due to its decreased parasitic capacitance.

Dielectrically isolated semiconductor devices have active regions which are separated from adjacent semiconductor devices by an insulation layer, and thus have improved device performance. Conventional dielectrically isolated semiconductor devices are formed in SOI, including an insulation layer below an active region, an trench isolation surrounding the active region, and interlayer dielectric layer above the active region. For example, an oxide isolation semiconductor device has an active region almost completely surrounded by an insulation layer, only with conductive vias in the interlayer dielectric layer to reach a doped region. The conductive vias provide electrical connection path from the semiconductor device to external circuits.

Because it is difficult to form single-crystal silicon directly on an oxide layer by epitaxial growth, the dielectrically isolated semiconductor device is typically formed by a process in which an SOI wafer is formed in advance, or formed from a commercially available SOI wafer. Then, an active region of a semiconductor device is formed in a semiconductor layer of the SOI wafer. One of conventional processes for manufacturing the SOI wafer includes bonding an oxide layer and single-crystal silicon in high temperature to have a stack of the single-crystal silicon and the oxide layer as the SOI wafer. This SOI process is complex and expensive, which increases the manufacture cost of the dielectrically isolated semiconductor devices.

Thus, it is desirable to provide a simple process for manufacturing dielectrically isolated semiconductor devices, so that the manufacturing cost is reduced.

BRIEF DESCRIPTION OF THE DISCLOSURE

In view of this, one object of the present disclosure is to provide a dielectrically isolated semiconductor device using a simple semiconductor substrate and a method for manufacturing the same, which needs no an SOI wafer to be formed in advance and has reduced manufacture cost.

According to one aspect of the disclosure, there is provided a dielectrically isolated semiconductor device, comprising: a semiconductor substrate; a first semiconductor layer above the semiconductor substrate; a second semiconductor layer above the first semiconductor layer; a semiconductor island in the second semiconductor layer; and a first dielectric isolation layer surrounding a bottom and sidewalls of the semiconductor island, wherein the first dielectric isolation layer comprises a first portion which is formed from a portion of the first semiconductor layer and extending along the bottom of the semiconductor island, and a second portion which is formed from a portion of the second semiconductor layer and extending along the sidewalls of the semiconductor island.

Preferably, the dielectrically isolated semiconductor device further comprises a buried semiconductor layer in the semiconductor substrate, with a portion of the semiconductor substrate above the semiconductor buried layer as the first semiconductor layer.

Preferably, the buried semiconductor layer comprises an opening into which the first dielectric layer extends.

Preferably, the dielectrically isolated semiconductor device further comprises a second insulation layer on the second semiconductor layer and which covers a surface of the semiconductor island, and conductive vias which reach the semiconductor island through the second insulation layer.

Preferably, the buried semiconductor layer is located below the surface of the semiconductor substrate at a depth larger than 2 micrometers.

Preferably, the first insulation layer has a thickness less than 2 micrometers.

Preferably, the semiconductor substrate and the first semiconductor layer are of a first doping type and the buried semiconductor layer, the second semiconductor layer and the semiconductor island are of a second doping type opposite to the first doping type.

Preferably, the first doping type is one of the N type and P type, and the second doping type is the other one of the N type and the P type.

Preferably, the dielectrically isolated semiconductor device further comprises a plurality of doped regions which are of one of a first doping type and a second doping type, in the semiconductor island.

Preferably, the dielectrically isolated semiconductor device is one of a diode and a transistor.

Preferably, at least one of the first semiconductor layer and the second semiconductor layer is an epitaxial semiconductor layer.

According to another aspect of the disclosure, there is provided a method for manufacturing a dielectrically isolating semiconductor device, comprising: forming a first semiconductor layer above the semiconductor substrate; forming a second semiconductor layer above the first semiconductor layer; and forming a first dielectric isolation layer with a portion of the first semiconductor layer and a portion of the second semiconductor layer, wherein the first dielectric isolation layer defines a semiconductor island in the second semiconductor layer, and the portion of the first semiconductor layer extends along a bottom of the semiconductor island and forms a first portion of the first dielectric isolation layer, and the portion of the second semiconductor layer extends on the sidewalls of the semiconductor island and forms a second portion of the first dielectric isolation layer.

Preferably, the step of forming the first semiconductor layer further comprises forming a buried semiconductor layer in the semiconductor substrate, the buried semiconductor layer being located below the first semiconductor layer and having an opening through which the first semiconductor layer reaches the semiconductor substrate.

Preferably, the buried semiconductor layer is located below the surface of the semiconductor substrate at a depth larger than 2 micrometers.

Preferably, the portion of the semiconductor substrate above the buried semiconductor layer forms the first semiconductor layer.

Preferably, the step of forming the buried semiconductor layer comprises: forming a doped region as the buried semiconductor layer in the semiconductor substrate by ion implantation.

Preferably, implantation energy of the ion implantation is between 800 keV to 1500 keV.

Preferably, the step of forming the first dielectric isolation layer comprises: converting the portion of the second semiconductor layer and the portion of the semiconductor substrate into porous silicon by anodization; and converting the porous silicon into silicon oxide.

Preferably, before the step of anodization, the method further comprises forming a first doped region in the second semiconductor layer to reach the first portion of the semiconductor substrate.

Preferably, the step of anodization comprises: immersing a semiconductor structure having been formed into an etchant solution; and flowing an electric current through the first doped region, the first semiconductor layer and the semiconductor substrate.

Preferably, before the step of immersing into the etchant solution, the method further comprises: covering a surface of the second semiconductor layer with a mask; forming an opening in the mask to expose a portion of a surface of the first doped region; electrically coupling a first conductive wire to a surface of the first doped region which is used as anode; and electrically coupling a second conductive wire to a surface of the semiconductor substrate which is used as cathode.

Preferably, the step of anodization only etches semiconductor material of the first doping type.

Preferably, the semiconductor substrate and the first semiconductor layer are of a first doping type and the buried semiconductor layer, the second semiconductor layer and the semiconductor island are of a second doping type opposite to the first doping type.

Preferably, the first doping type is one of an N type and a P type, and the second doping type is the other of the N type and the P type.

Preferably, after the step of forming the first dielectric isolation layer, the method further comprises forming a plurality of doped regions of the dielectrically isolating semiconductor device in the semiconductor island.

Preferably, at least one of the first semiconductor layer and the second semiconductor layer are formed by epitaxial growth.

The dielectrically isolated semiconductor device according to an embodiment of the disclosure has the first dielectric isolation layer with the first portion formed from a portion of the first semiconductor layer and extending along a bottom of the semiconductor island, and the second portion formed from a portion of the second semiconductor layer and extending along the sidewalls of the semiconductor island. The dielectrically isolated semiconductor devices needs no an SOI wafer to be formed in advance, which simplifies the process and reduces manufacturing cost. This first dielectric isolation layer surrounds the bottom and sidewalls of the semiconductor island, so as to separate the semiconductor device both from the semiconductor substrate vertically and from adjacent semiconductor devices laterally. The dielectrically isolated semiconductor devices has decreased parasitic capacitance for high-speed applications.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF EMBODIMENTS OF THE DISCLOSURE

Figure 1:
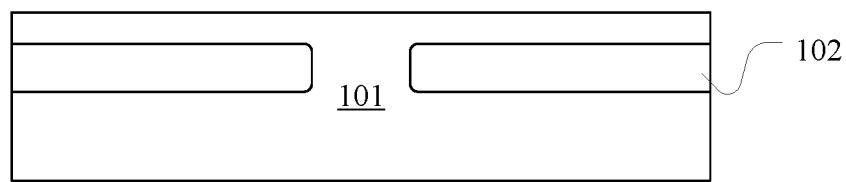
FIGS. 1 to 10 are cross-sectional views illustrating various steps of a method for manufacturing a dielectrically isolated semiconductor device according to an embodiment of the present disclosure.

Exemplary embodiments of the present disclosure will be described in more details below with reference to the accompanying drawings. In the drawings, like reference numerals denote like members. The figures are not drawn to scale, for the sake of clarity. Moreover, some well known parts may not be shown. For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins the another region, but not in a implantation region of the another region.

In the present application, the term "semiconductor structure" means generally the whole semiconductor structure formed at each step of the method for manufacturing the semiconductor device, including all of the layers and regions having been formed.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Unless the context clearly indicates otherwise, each part of the semiconductor device can be made of material(s) well known to one skilled person in the art. The semiconductor material includes for example group-III-V semiconductor, such as GaAs, InP, GaN, and SiC, and group IV semiconductor, such as Si, and Ge.

The disclosure can be embodied in various forms. The disclosure will be described with a process for manufacturing diodes as an example.

FIGS. 1 to 10 are cross-sectional views illustrating various steps of a method for manufacturing a dielectrically isolated semiconductor device according to an embodiment of the present disclosure.

As shown in FIG. 1, a buried semiconductor layer 102 is formed in the semiconductor substrate 101 by ion implantation. The semiconductor substrate 101 and the buried semiconductor layer 102 are of the first doping type and second typing type, respectively. The first doping type and the second doping type are opposite to each other.

The first doping type is one of an N type and a P type, and the second doping type is the other of the N type and the P type. An N-type semiconductor layer or region may be formed by implanting an N-type dopant such as P or As in the semiconductor layer or region. A P-type semiconductor layer or region may be formed by implanting a P-type dopant such as B in the semiconductor layer or region. In one embodiment, the semiconductor substrate 101 is P-doped, and the buried semiconductor layer 102 is N-doped.

The doping depth and doping concentration profile in the semiconductor substrate 101 can be controlled by controlling implantation energy and dopant dosages in ion implantation. Preferably, the buried semiconductor layer 102 is located below the surface of the semiconductor substrate 101 at a depth larger than 2 micrometers, completely embedded in the semiconductor substrate 101. For this, implantation energy in ion implantation is about 800 keV to 1500 keV. The high implantation energy is used to have the desired depth. Moreover, it is preferable to use a dopant with a low diffusion coefficient in order to decrease the distribution area of the doped region. For example, arsenic can be used as a dopant to form an N-type buried layer, which is preferable because it has a low diffusion coefficient.

In this embodiment, the buried semiconductor layer 102 is a patterned layer which includes an opening. For this, a photoresist layer is formed on the semiconductor substrate 101, and then patterned by lithography to be a photoresist mask which has an opening, and then performs the ion implantation through the photoresist mask. The photoresist mask is used as a blocking mask in ion implantation. The pattern of the opening of the photoresist mask is the same as that of the buried semiconductor layer 102 to be formed. Then, the photoresist mask is removed by ashing or dissolution with a solvent.

Because the buried semiconductor layer 102 includes an opening, the semiconductor substrate 101 includes a first portion above the buried semiconductor layer 102, a second portion below the buried semiconductor layer 102 and a joint portion which connects the first portion and the second portion. In this embodiment, the first portion of the semiconductor substrate 101 above the buried semiconductor layer 102 is used as the first semiconductor layer 103. The depth of the buried semiconductor layer 102, i.e. the thickness of the first semiconductor layer 103, is controlled by controlling parameters in the ion implantation. In an alternative embodiment, the first semiconductor layer 103 is formed by epitaxial growth. The thickness of the first semiconductor layer 103 is controlled by controlling the process of the epitaxial growth.

The dopant is not implanted into the joint portion of the semiconductor layer 101 because of blocking of the photoresist mask so that the first portion and the second portion of the semiconductor substrate 101 are connected by the joint portion. The joint portion will be used as a part of a current path in a following anodization process. Preferably, the first portion of the semiconductor substrate 101 has a thickness of the same order of magnitude as a width or diameter of the joint portion, for example about 2 micrometers, for controlling a current direction and high current density in the following anodization process.

Figure 2:
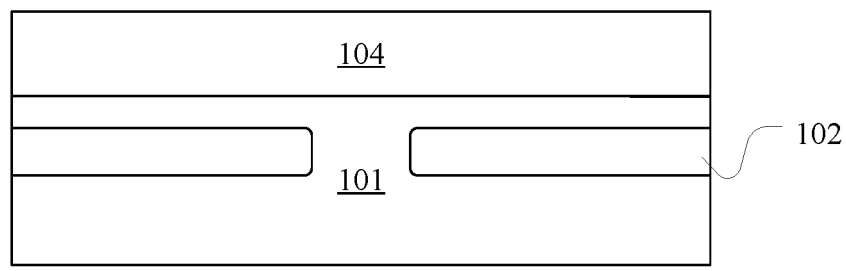

Next, a second semiconductor layer 104 is formed on the surface of the semiconductor substrate 101, as shown in FIG. 2. The second semiconductor layer 104 is of the second doping type.

A conventional deposition process may be selected to form the second semiconductor layer 102, such as chemical vapor deposition (CVD), atomic layer deposition (ALD) and so on. For example, the semiconductor substrate 101 is a single-crystal substrate and the second semiconductor layer 102 is an epitaxial silicon layer.

In this embodiment, by controlling parameters such as deposition time, the epitaxial semiconductor layer 104 has a thickness which is adjusted in a range between 1 micrometer and 10 micrometers, more preferably, in a range between 2 micrometers and 4 micrometers. By controlling doping concentration, the second semiconductor layer 104 has resistivity which is adjusted in a range between 1 Ω·cm and 100 Ω·cm, more preferably, in a range between 5 Ω·cm and 10.0 Ω·cm.

Figure 3:
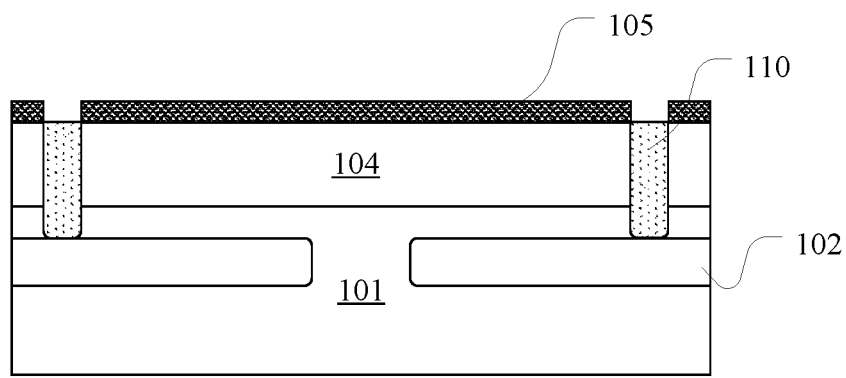

Next, a photoresist layer is formed on a surface of the second semiconductor layer 104 and then patterned by lithography to be a mask 105 with an opening therein. Next ion implantation is performed through the mask 105 to form the first doped region 110, as shown in FIG. 3. The mask 105 is used as a blocking mask in the ion implantation. The pattern of the opening of the mask 105 is the same as that of the doped region to be formed. The mask 105 is still remained for the following step after the ion implantation.

The first doped region 110 and the semiconductor substrate 101 have the same doping type, i.e. the first doping type in this example. However, the first doped region 110 is heavily doped over the semiconductor substrate 101. By controlling the implantation energy and dopant amount in the ion implantation, the first doped region 110 extends from the surface of the second semiconductor layer 104 to the first portion of the semiconductor substrate 101. Preferably, the first doped region 110 extends downward to reach the surface of the buried semiconductor layer 102.

The first doped region 110 is used as a part of a current path in the following anodization process. Preferably, the first doped region 110 has a width or a diameter of the same order of magnitude as a thickness of the first portion of the semiconductor substrate 101, for example in a range less than 2 micrometers, in order to control a current direction and to obtain high current density in the anodization process.

Figure 4:
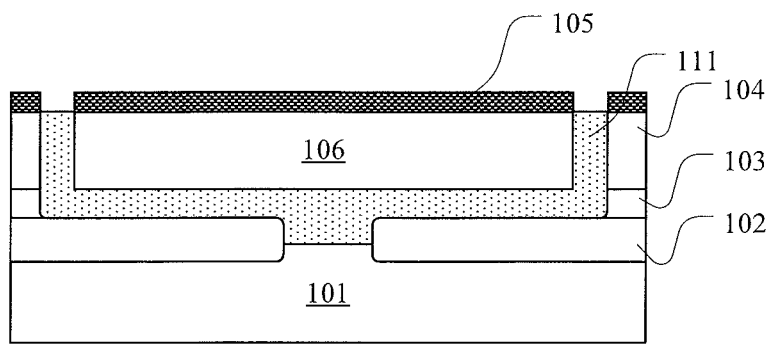

Next, the anodization process is performed for converting a portion of the first doped region 110 and a portion of the semiconductor substrate 101 into porous silicon so as to form a porous silicon layer 111, as shown in FIG. 4.

The whole semiconductor structure are immersed in an etchant solution in the anodization process. One conductive wire is connected to the first doped region 110 which is used as an anode, and the other conductive wire is connected to the semiconductor substrate 101 which is used as a cathode. Then, an electric current flows between the anode and cathode through the conductive wires. The first doped region 110, the first portion of the semiconductor substrate 101, the joint portion of the semiconductor substrate 101 and the second portion of the semiconductor substrate 101 have the same doping type and connects with each other. Thus, electric current successively flows through these regions. In a case that current density is larger than a predetermined value, the semiconductor layer in the electric current path gradually loses electrons to form the porous silicon.

In this embodiment, the surface of the first doped region 110 contacts the conductive wire. Accordingly, the first doped region 110 is gradually converted into oxide, starting from this surface. The first doped region 110, the first portion and the joint portion of the semiconductor substrate 101 have a section size smaller than that of the second portion of the semiconductor substrate 101 in the electric current direction.

By choosing a suitable current value, the first doped region 110, and the first portion and the joint portion of the semiconductor substrate 101 will be partially converted into oxide to form a porous silicon layer 111, if having a current density larger than a predefined value. Meanwhile, the second portion of the semiconductor substrate 101 will remain as a semiconductor layer, because it has a large section size in the electric current direction and has current density smaller than a predetermined value.

In the above anodization process, the mask 105 defines an area of the first doped region of the first doping type, through which the electric current flows into the semiconductor structure. The buried semiconductor layer 102 and the semiconductor substrate 101 have opposite doping types which limits an electric current path. Consequently, the electric current can only flow laterally in the semiconductor layer above the buried semiconductor layer 102. Then, the electric current flows to a back surface of the semiconductor substrate 101 through the opening of the buried semiconductor layer 102. This measures for restricting the electric current path can improve quality and have uniform thickness of the porous silicon layer 111.

In the preferable embodiment, the step of anodization only etches semiconductor material of the first doping type.

Figure 5:
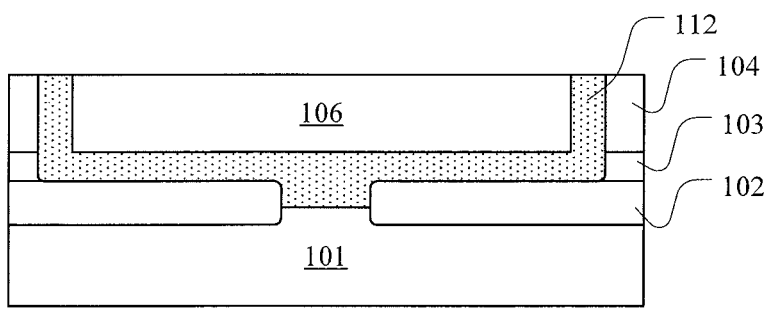

Then, after the anodization process, the mask 105 is removed by ashing or dissolution with a solvent. Next, the semiconductor structure is taken out from the etchant solution and dried. Then, the porous silicon layer 111 is oxidized to form the first dielectric isolation layer 112 by oxidation in oxidizing atmosphere, as shown in FIG. 5.

The second semiconductor layer 104 is separated into the semiconductor island 106 by the first dielectric isolation layer 112. The bottom and sidewalls of the semiconductor island 106 are defined by the first dielectric isolation layer 112. In this step, the first portion of the semiconductor substrate 101 is also separated by the first dielectric isolation layer 112.

Figure 6:
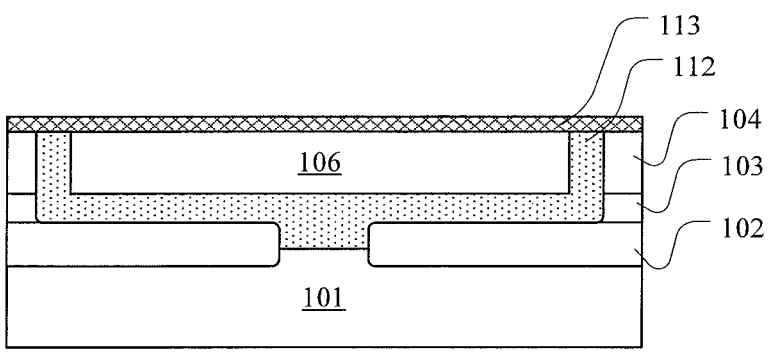

Next, a second dielectric isolation layer 113 is formed on the surface of the semiconductor structure by the above conventional deposition process, as shown in FIG. 6. For example, the second dielectric isolation layer 113 is formed from one of oxide, nitride and oxynitride. The second dielectric isolation layer 113 covers the surface of the second semiconductor layer 104, including the surface of the semiconductor island 106. The semiconductor island 106 is separated from adjacent semiconductor regions by the first dielectric isolation layer 112 and the second dielectric isolation layer 113.

Figure 7:
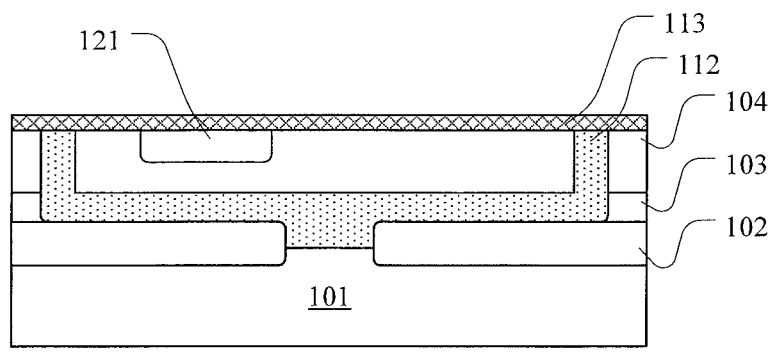
Figure 8:
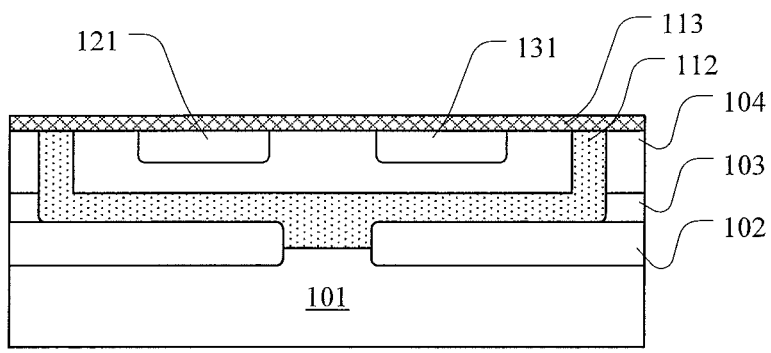

Next, the second doped region 121 and the third doped region 131 are formed in the semiconductor island 106 of the second semiconductor layer 104, by ion implantation, as shown in FIG. 7 and FIG. 8.

The dopant penetrates through the second dielectric isolation layer 113 to reach the semiconductor island 106 of the second semiconductor layer 104 in ion implantation. The second doped region 121 and the third doped region 131 are respectively of the second doping type and the first doping type. The second doped region 121 has the same doping type with the second semiconductor 104 and is relatively heavily doped. A PN junction of the diode is formed between the third doped region 131 and the second semiconductor layer 104.

Next, a photoresist layer is formed on the surface of the semiconductor structure and then patterned by lithography to be a mask with an opening therein. The etching is performed by using the mask, which may be dry etching such as ion beam milling, plasma etching, reactive ion etching, laser ablation and the like, or wet etching using a selective solution of etchant.

Figure 9:
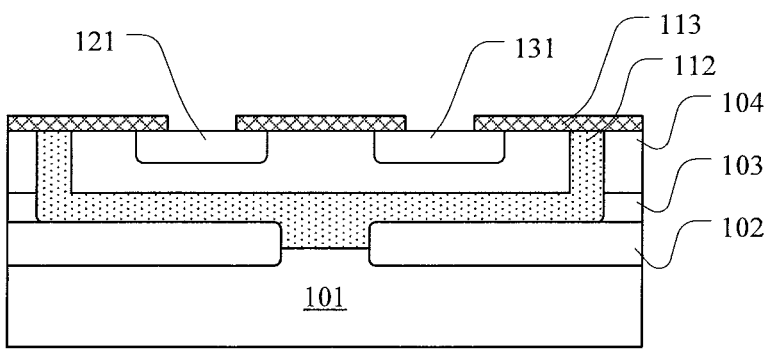

This etching is performed downward from the opening of the photoresist mask to form an opening in the second dielectric isolation layer 113 to expose portions of a surface of the second doped region 121 and the third doped region 131, as shown in FIG. 9. Due to selectivity of the etchant, the etching stops at the surface of the second doped region 121 and the third region 131. Then, the photoresist mask is removed by ashing or dissolution with a solvent.

Next, a conductor layer is then formed on the surface of the semiconductor structure by the above conventional deposition process. For example, the conductor layer may be made of gold, silver, aluminum, copper or metal alloy thereof. The conductor layer covers the surface of the second dielectric isolation layer 113, fills the opening, and contacts the second doped region 121 and the third doped region 131.

Figure 10:
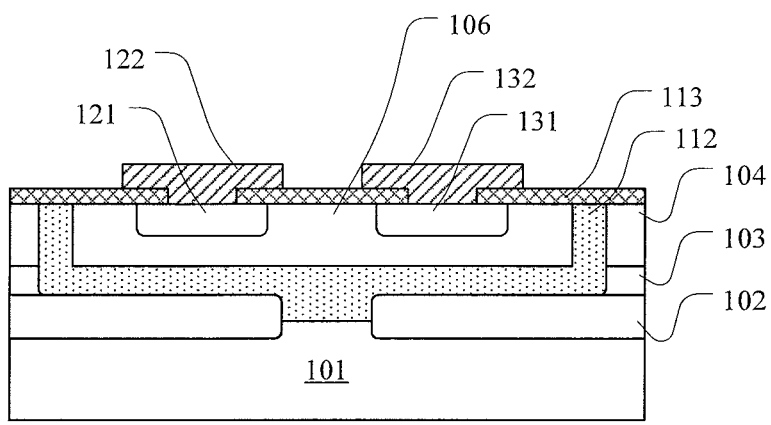

A mask is formed from a photoresist layer. The conductor layer is patterned to form a cathode contact on the second doped region 121, and an anode on the third doped region 131, as shown in FIG. 10.

The dielectrically isolated semiconductor device 100 includes the semiconductor substrate 101, the second semiconductor layer 104 on the semiconductor substrate, the semiconductor island 106 in the second semiconductor layer 104 and the first dielectric isolation layer 112 surrounding a bottom and sidewalls of the semiconductor island 106. The first dielectric isolation layer 112 includes a portion of the second semiconductor layer 104 and a portion of the semiconductor substrate 101.

Preferably, the dielectrically isolating semiconductor device 100 further includes a buried semiconductor layer 102 in the semiconductor substrate 101. The buried semiconductor layer 102 defines a portion of the first dielectric isolation layer 112 extending along the bottom of the semiconductor island 106.

Preferably, the buried semiconductor layer 102 includes an opening, and the first dielectric isolation layer 112 extends into the opening.

Preferably, the dielectrically isolating semiconductor device 100 further includes a second insulation layer 113 above the second semiconductor layer 104, which covers the surface of the semiconductor island 106, and conductive vias which extend through the second insulation layer 113 to the semiconductor island 106.

Preferably, the buried semiconductor layer 102 is located below the surface of the semiconductor substrate 101, at a depth larger than 2 micrometers.

Preferably, the first insulation layer has a thickness less than 2 micrometers.

Preferably, the dielectrically isolated semiconductor device 100 further includes a second doped region 121 and a third region 131 in the semiconductor island 106.

Preferably, the dielectrically isolating semiconductor device 100 further includes a third semiconductor layer between the first semiconductor layer and the second semiconductor layer 104. The third semiconductor layer is of the first doping type.

In above embodiment, an example dielectrically isolating semiconductor device including a semiconductor island 106 of a second doping type is described. In an alternative embodiment, the semiconductor island 106 of the first doping type may be formed according to the device types. For this, the doping types of the semiconductor substrate 101, the buried semiconductor layer 102, the first semiconductor layer 103, the second semiconductor layer 104 and the first doped region 110 need to be reversed, comparing with those in the above embodiments.

In above embodiment, a diode is described, as an example of the dielectrically isolating semiconductor device. In an alternative embodiment, the dielectrically isolating semiconductor device may be a transistor. The semiconductor island defined by the first dielectric isolation layer and the second dielectric isolation layer can be used to form an active region of the transistor. Further, conductive vias are formed in the second dielectric isolation layer and extends to reach the doped region, so as to provide electrical connection path from the semiconductor components to external circuits.

In the above description, no details are given for patterning and etching various layers. Nevertheless, one skilled person will appreciate that the layers and regions having desired shapes can be formed by various approaches well known in the field. Moreover, one skilled person may propose a process completely different from the above processes for providing the same structure. Furthermore, although various embodiments are described in different paragraphs, it does not mean that technical approaches in different embodiments cannot be combined advantageously.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element.

If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

What is claimed is:

1. A dielectrically isolated semiconductor device, comprising:
   a semiconductor substrate;
   a first semiconductor layer above a buried semiconductor layer in said semiconductor substrate;
   a second semiconductor layer above said first semiconductor layer;
   a semiconductor island which is a first portion of said second semiconductor layer; and
   a first dielectric isolation layer surrounding said semiconductor island,
   wherein said first dielectric isolation layer is formed from a first portion of said first semiconductor layer that extends along a bottom of said semiconductor island and a second portion of said second semiconductor layer that extends along sidewalls of said semiconductor island,
   said buried semiconductor layer comprises an opening through which said first dielectric isolation layer extends,
   said buried semiconductor layer has a doping type opposite to that of said first semiconductor layer, and limits an electric current path in an anodization process.

2. The dielectrically isolated semiconductor device according to claim 1, further comprising a second insulation layer on said second semiconductor layer and which covers a surface of said semiconductor island, and conductive vias which reach said semiconductor island through said second insulation layer.

3. The dielectrically isolated semiconductor device according to claim 1, wherein said buried semiconductor layer is located below said surface of said semiconductor substrate at a depth larger than 2 micrometers.

4. The dielectrically isolated semiconductor device according to claim 1, wherein said first insulation layer has a thickness less than 2 micrometers.

5. The dielectrically isolated semiconductor device according to claim 1, wherein said semiconductor substrate and said first semiconductor layer are of a first doping type, and said buried semiconductor layer, said second semiconductor layer and said semiconductor island are of a second doping type opposite to said first doping type.

6. The dielectrically isolated semiconductor device to claim 1, wherein said first doping type is one of an N type and a P type, and said second doping type is other of said N type and said P type.

7. The dielectrically isolated semiconductor device according to claim 1, further comprising a plurality of doped regions which are of one of a first doping type and a second doping type, in said semiconductor island.

8. The dielectrically isolated semiconductor device according to claim 1, wherein said dielectrically isolated semiconductor device is one of a diode and a transistor.

9. The dielectrically isolated semiconductor device to claim 1, wherein at least one of said first semiconductor layer and said second semiconductor layer is an epitaxial semiconductor layer.

10. A method for manufacturing a dielectrically isolating semiconductor device, comprising:
    forming a first semiconductor layer above a buried semiconductor layer in a semiconductor substrate;
    forming a second semiconductor layer above said first semiconductor layer; and
    forming a first dielectric isolation layer by an anodization process, which surrounds a semiconductor island that is a portion of said second semiconductor layer,
    wherein said first dielectric isolation layer is formed from a first portion of said first semiconductor layer that extends along a bottom of said semiconductor island, and a second portion of said second semiconductor layer that extends along sidewalls of said semiconductor island, said buried semiconductor layer comprises an opening through which said first dielectric isolation layer extends, said buried semiconductor layer has a doping type opposite to that of said first semiconductor layer, and limits an electric current path in said anodization process.

11. The method according to claim 10, wherein said buried semiconductor layer is located below said surface of said semiconductor substrate at a depth larger than 2 micrometers.

12. The method according to claim 10, wherein said buried semiconductor layer is a doped region in said semiconductor substrate by ion implantation.

13. The method according to claim 12, wherein implantation energy of said ion implantation is between 800 keV to 1500 keV.

14. The method according to claim 10, wherein said step of forming said first dielectric isolation layer comprises:
converting said first portion of said first semiconductor layer and said second portion of said second semiconductor layer into porous silicon by anodization; and
converting said porous silicon into silicon oxide.

15. The method according to claim 14, before said step of anodization, further comprising forming a first doped region in said second semiconductor layer to reach said first semiconductor layer.

16. The method according to 14, wherein said step of anodization comprises:
immersing a semiconductor structure having been formed into an etchant solution; and
flowing an electric current through said first doped region, said first semiconductor layer and said semiconductor substrate.

17. The method according to claim 16, before said step of immersing into said etchant solution, further comprising:
covering a surface of said second semiconductor layer with a mask;
forming an opening in said mask to expose a portion of a surface of said first doped region;
electrically coupling a first conductive wire to a surface of said first doped region which is used as anode; and
electrically coupling a second conductive wire to a surface of said semiconductor substrate which is used as cathode.

18. The method according to claim 14, wherein said step of anodization only etches semiconductor material of a first doping type.

19. The method according to claim 10, wherein said semiconductor substrate and said first semiconductor layer are of a first doping type and said buried semiconductor layer, said second semiconductor layer and said semiconductor island are of a second doping type opposite to said first doping type.

20. The method according to claim 19, wherein said first doping type is one of an N type and a P type, and said second doping type is the other of said N type and said P type.

21. The method according to claim 10, after said step of forming said first dielectric isolation layer, further comprising forming a plurality of doped regions of said dielectrically isolating semiconductor device in said semiconductor island.

22. The method according to claim 10, wherein at least one of said first semiconductor layer and said second semiconductor layer are formed by epitaxial growth.

* * * * *